(12) United States Patent
Glass (10) Patent No.: US 7,088,174 B2  
(45) Date of Patent: Aug. 8, 2006

(54) OFFSET CANCELLATION AND SLICE ADJUST AMPLIFIER CIRCUIT

(75) Inventor: Kevin W. Glass, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/745,428

(22) Filed: Dec. 22, 2003

(65) Prior Publication Data

US 2005/0134371 A1 Jun. 23, 2005

(51) Int. Cl.
*H03F 1/02* (2006.01)

(52) U.S. Cl. ............................................. 330/9; 330/11
(58) Field of Classification Search .................... 330/9, 330/11, 308; 327/307
See application file for complete search history.

(56) References Cited

U.S. PATENT DOCUMENTS

| | | |
|---|---|---|
| 3,919,482 A | 11/1975 | Hamada |
| 4,634,995 A | 1/1987 | Nakagawa et al. |
| 4,772,859 A | 9/1988 | Sakai |
| 5,802,464 A | 9/1998 | Ashida |
| 5,986,502 A | 11/1999 | Nakamura |
| 6,657,488 B1 * | 12/2003 | King et al. .................... 330/9 |

OTHER PUBLICATIONS

Y. Greshishchev et al., "A 60-dB Gain, 55-dB Dynamic Range, 10-GB/s Broad-Band SiGe HBT Limiting Amplifier", IEEE, 1999, pp. 1914-1920, vol. 34, Issue 12.

M. Moller et al., "15Gbit/s High-Gain Limiting Amplifier Fabricated Using Si-Bipolar Production Technology", Electronics Letters, Sep. 1, 1994, pp. 1519-1521, vol. 30, No. 18.

J. Akagi et al., "AlGaAs/GaAs HBT Receiver ICs for a 10 Gbps Optical Communication System", IEEE, GaAs IC Symposium, 1990, pp. 45-48.

M. Nakamura et al., "A 15-GHz AlGaAs/GaAs HBT Limiting Amplifier with Low Phase Deviation", GaAs IC Symposium, IEEE, 1991, pp. 45-48.

I. Anderson et al., "Silicon Bipolar Chipset for SONET/SDH 10 Gbit/s Fiber-Optic Links", IEEE 1994 Custom Integrated Circuits Conference, May 1-4, 1994, pp. 617-620.

K. Runge et al., "High Speed AlGaAs/GaAs HBT Circuits For Up To 40 Gb/s Optical Communication", GaAs IC Symposium, IEEE, 1997, pp. 211-214.

(Continued)

*Primary Examiner*—Steven J. Mottola
(74) *Attorney, Agent, or Firm*—Kacvinsky LLC (57) ABSTRACT

A method and apparatus to provide slice adjustment and offset cancellation in a high frequency limiting amplifier is described.

16 Claims, 4 Drawing Sheets

OTHER PUBLICATIONS

T. Masuda et al., "45GHz Transimpedance 32dB Limiting Amplifier and 40Gb/s 1:4 High-Sensitivity Demultiplexer with Decision Circuit Using SiGe HBTs for 40Gb/s Optical Receiver", ISSCC 2000, Session 3, Gigabit-Rate Communications, Paper MP 3.6, IEEE, 2000, pp. 60-61 snd 447.

Y. Baeyens et al., "InP D-HBT IC'S For 40 Gb/s and Higher Bitrate Lightwaave Tranceivers", GaAs IC Symposium, 2001 IEEE GaAs Digest, 2001, pp. 125-128.

G. Georgiou et al., "Clock and Data Recovery IC for 40-Gb/s Fiber-Optic Receiver", IEEE, Sep. 2002, pp. 1120-1125, vol. 37, No. 9.

Y. Baeyens et al., "InP D-HBT ICs for 40-Gb/s and Higher Bitrate Lightwave Transceivers", IEEE, Sep. 2002, pp. 1152-1159, vol. 37, No. 9.

G. Freeman et al., "40-Gb/s Circuits Built From A 120-GHz f/sub T/SiGe Technology", IEEE, Sep. 2002, pp. 1106-1114, vol. 37, No. 9.

K. Runge et al., "Silicon Bipolar Integrated Circuits for Multi-Gb/s Optical Communication Systems", IEEE, Jun. 1991, pp. 636-644, vol. 9, No. 5.

M. Nakamura et al., "A Limiting Amplifier with Low Phase Deviation Using an AlGaAs/GaAs HBT", IEEE, Oct. 1992, pp. 1421-1427, vol. 27, No. 10.

L. Ingmar Anderson et al., "Silicon Bipolar Chipset for SONET/SDH 10 Gb/s Fiber-Optic Communication Links", IEEE, Mar. 1995, pp. 210-218, vol. 30, No. 3.

M. Yung et al., "Highly Integrated InP HBT Optical Receivers", IEEE, Feb. 1999, pp. 219-217, vol. 34, No. 2.

Z. Wang et al., "17GHz-Bandwith 17dB-Gain 0.3um-HEMT Low-Power Limiting Amplifier", Symposium on VLSI Circuits Digest of Technical Papers, 1995, pp. 97-98.

S. Khorram et al., "A CMOS Limiting Amplifier and Signal-Strength Indicator", Symposium on VLSI Circuits Digest of Technical Papers, 1995, pp. 95-96.

B. Kwark et al., "AlGaAs/GaAs HBT Limiting Amplifier for 10Gbps Optical Transmission System", IEEE Radio Frequency Integrated Circuits Symposium, 1997, pp. 55-58.

F. Centurrelli et al., "Input-Matching and Offset-Compensation Network for Limiting Amplifiers in Optical Communication Systems", SSMSD '99, IEEE, 1999, pp. 113-116.

G. Georgiou et al., "High Gain Limiting Amplifier for 10Gbps Lightwave Receivers", 11th International Conference on Indium Phosphide and Related Materials, IEEE, 1999, pp. 71-74.

T. Morikawa et al., "A SiGe Single-Chip 3.3 V Receiver IC for 10 Gb/s Optical Communication Systems", ISSCC99, Session 22, Paper WP 22.3, IEEE, 1999, pp. 380-38811.

M. Nakamura et al., "An Instantaneous Response CMOS Optical Receiver IC with Wide Dynamic Range and Extremely High Sensitivity Using Feed-Forward Auto-Bias Adjustment", IEEE, Sep. 1995, pp. 991-997, vol. 30, No. 9.

A.I. Drukarev, "Noise Performance and SNR Threshold in PFM", IEEE, Jul. 1985, pp. 708-711, vol. 33, No. 7.

C. Eldering, "Theoretical Determination of Sensitivity Penalty for Burst Mode Fiber Optic Receivers", Journal of Lightwave Technology, IEEE, Dec. 1993, pp. 2145-2149, vol. 11, No. 12.

G. Smith et al., "Accelerated Measurement of Low BERs in Fiber Optic Communication System", OFC/IOOC '99, Technical Digest, 1999, pp. 334, vol. 2.

J. Winters et al., "Adaptive Nonlinear Cancellation for High-Speed Fiber-Optic Systems ", Journal of Lightwave Tech., IEEE, Jul. 1992, pp. 971-977, vol. 10, No. 7.

V. Arya et al., "Application of Optical Preamplification to Optimize Receiver Sensitivity in Spectrum-Sliced WDM Communication Systems", Lasers and Electro-Optics SocietyAnnual Meeting, LEOS '96, 1996, pp. 250-251, vol. 2.

* cited by examiner

OFFSET CANCELLATION AND SLICE ADJUST AMPLIFIER CIRCUIT

BACKGROUND

A high speed optical communication system may communicate information using optical signals. Optical communication systems may use a limiting amplifier to amplify a received signal to a gain level sufficient for further processing by the receiver. The limiting amplifier may need to perform offset cancellation and slice adjustment to produce a reliable input signal for subsequent signal processing. Consequently, improvements in offset cancellation and slice adjust techniques may increase performance of the limiting amplifier. Accordingly, there may be a need for improvements in such techniques in a device or network.

BRIEF DESCRIPTION OF THE DRAWINGS

The subject matter regarded as embodiments is particularly pointed out and distinctly claimed in the concluding portion of the specification. The embodiments, however, both as to organization and method of operation, together with objects, features, and advantages thereof, may best be understood by reference to the following detailed description when read with the accompanying drawings in which:

DETAILED DESCRIPTION

The embodiments may be directed to high speed optical communication systems. One embodiment may use a limiting amplifier to amplify a received signal to a gain level sufficient for further processing by the receiver. The limiting amplifier may comprise multiple stages, and may include an offset cancellation and slice adjust circuit as part of the decision threshold circuitry of the transceiver to produce a reliable input signal for subsequent signal processing. The offset cancellation and slice adjust circuit may improve the decision level processing contributed by the limiting amplifier in an optical transceiver.

In one embodiment, the offset cancellation and slice adjust circuit may improve offset cancellation for the limiting amplifier. For example, as device sizes become smaller in an effort to reduce space and increase speed in these circuits, process induced variations in device manufacturing are more probable. This may result in greater offsets. Circuits designed to provide amplifier offset cancellation, however, typically attempt to do so only at the input stage of the limiting amplifier. This limits the amount of amplifier offset that can be cancelled. One embodiment attempts to provide offset cancellation for a greater range of offsets, thereby improving performance of the limiting amplifier.

In one embodiment, the offset cancellation and slice adjust circuit may improve slice adjustments for the limiting amplifier. For example, amplifier circuits typically adjust the slice or decision level to accommodate signal noise. This process is typically referred to as "slice adjustment." Conventional slice adjust circuits, however, may only adjust the slice level up or down without regard to signal margin. If the amplifier does not amplify the data signal properly, receiver decision threshold processing may be compromised causing communication errors. One embodiment attempts to improve slice adjustment while maintaining sufficient signal margins to improve receiver decision threshold processing, thereby reducing communication errors by the receiver.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Numerous specific details may be set forth herein to provide a thorough understanding of the embodiments. It will be understood by those skilled in the art, however, that the embodiments may be practiced without these specific details. In other instances, well-known methods, procedures, components and circuits have not been described in detail so as not to obscure the embodiments. It can be appreciated that the specific structural and functional details disclosed herein may be representative and do not necessarily limit the scope of the embodiment.

Figure 1:
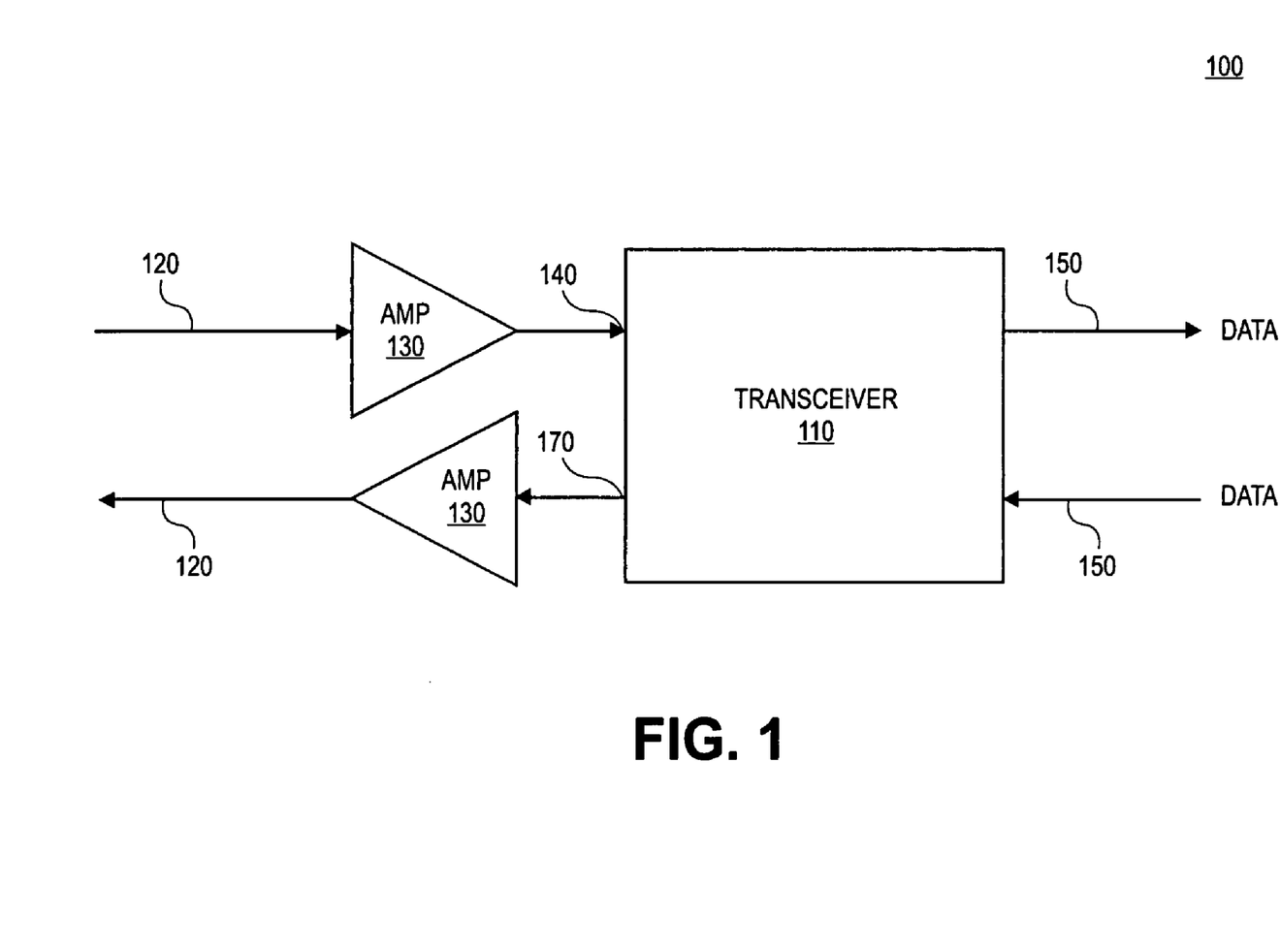
FIG. 1 illustrates a block diagram of a system suitable for practicing one embodiment.

Referring now in detail to the drawings wherein like parts are designated by like reference numerals throughout, there is illustrated in FIG. 1 a high speed optical communication system suitable for practicing one embodiment. FIG. 1 is a simplified block diagram of a communication system 100 comprising a transceiver module 110, transmission medium 120 configured to allow the propagation of a plurality of information signals, and amplifiers 130. The expression "information signals," as used herein, refers to an optical or electrical signal which has been coded with information. These signals are amplified during propagation by optical amplifiers disposed along the transmission medium and are incident on an optical receiver. System 100 is typically configured with transceivers at both ends of transmission medium 120 to accommodate bidirectional communication within a single line card. For ease of explanation, transceiver module 110 is shown with receive and transmit functionality. Additional amplifiers 130 may also be disposed along transmission medium 120 depending on the desired transmission distances and associated span losses in order to provide an information signal having a power level sufficient for detection and processing by transceiver 110.

In one embodiment, transceiver module 110 is configured to receive information signals from transmission medium 120 via input 140 and output its electrical data equivalent at output 150. The information signals or data may be modulated using non-return to zero (NRZ) format where the signal does not return to a logic 0 before the next successive data bit. For example, the data signal remains at a logic high or 1 if two successive 1 bits are transmitted. This modulation format may have a higher effective speed as compared to return to zero (RZ) modulation because the RZ modulation scheme requires twice the number of pulses for the same NRZ data transmission. The power levels associated with these transmitted signals vary significantly due to a number of effects such as span lengths, fiber type, splice losses, and so forth. These variations in signal power effect whether or not a particular signal is recognized by the receiver. Transceiver module 110 is also configured to receive data from input 160 and output its corresponding optical equivalent via output 170 for propagation along transmission medium 120. Typically, optical signals incident on transceiver 110 have amplitude variations that fall outside the dynamic range of a conventional amplifier, thus requiring additional signal processing as described below.

Figure 2:
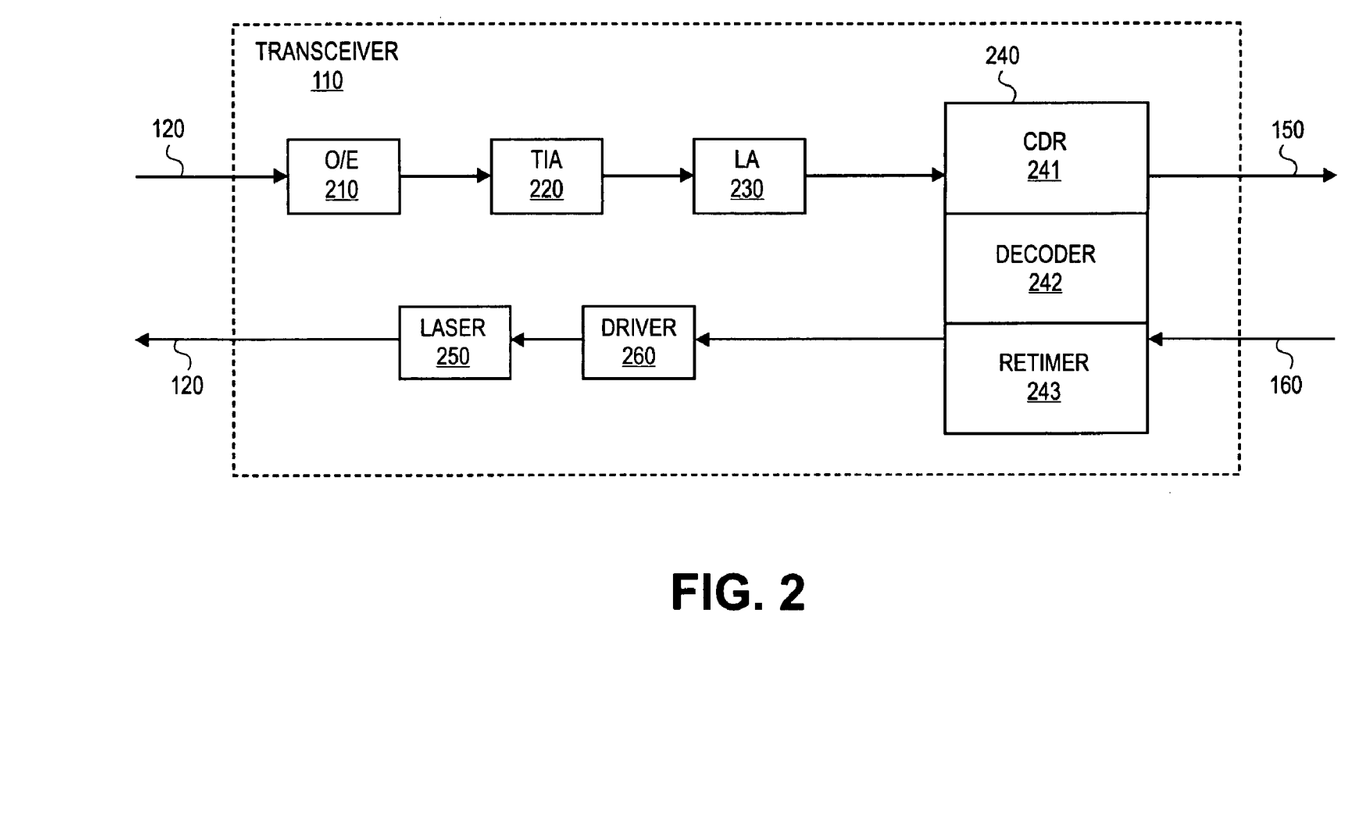
FIG. 2 illustrates a block diagram of a transceiver suitable for use in practicing one embodiment.

FIG. 2 illustrates a block diagram of transceiver 110 which may include an optical to electrical (O/E) converter module 210, transimpedence amplifier (TIA) 220, limiting amplifier 230, module 240 which includes a clock and data recovery circuit (CDR) 241 and decoder 242 for the receive side and laser 250, laser driver 260 and re-timer circuit or encoder 243 for the transmit side. Re-timer circuit 243 receives information signals in electrical form and supplies these signals to laser driver 260 which provides current variations proportional to the received information signals. Semiconductor laser 250 generates optical signals proportional to the received current levels for transmission over medium 120.

The receive side of transceiver 110 receives optical signals propagating along transmission medium 120 incident on O/E module 210 where optical energy is converted to small signal electrical current proportional to the received optical signals. A typical O/E module may include a semiconductor photodiode or photodetector configured to detect an individual or range of optical wavelengths. The electrical signals generated by the photodetector may be relatively weak and require conversion to a voltage equivalent as well as squaring-off of digital pulses, regenerating clock signals, and noise filtering induced by transmission and dark noise generated by the photodetector. Depending on the distances under which the optical signals travel along transmission medium 120, a preamplifier may also be disposed at or near O/E module 210 to increase the optical signal power incident on photodetector 210. For example, a preamplifier may be used to provide 1 mW of optical signal power to photodetector 210. A preamplifier is typically used in optical communication systems where signal attenuation from span losses and/or fiber nonlinearities is present.

The small signal current generated by photodetector 210 must be converted into a corresponding voltage for further processing. This conversion is accomplished by TIA 220 which is functionally equivalent to a resistor and is typically characterized by high transimpedance on the front end and low impedance on the back end. TIA 220 provides high transimpedance with low noise amplification, but must also provide a large bandwidth for the received signals. TIA 220 may be a two stage, common-source, common-drain or a single stage, common-gate amplifier. Because the current received by TIA 220 from O/E module 210 is small, TIA 220 likewise outputs corresponding small signal amplitude ranging from a few millivolts to a few hundred millivolts.

Limiting amplifier 230 functions to produce a consistent waveform in response to the input received from TIA 220. Again, because the input signal from the TIA 220 is small, the gain level provided by the limiting amplifier 230 may be significant. This gain is usually provided in multiple stages because high gain produced by a single stage amplifier is too unstable for high bandwidth communication receivers. In other words, amplifier 220 increases the voltage gain of the signals received from TIA 220 so that these signals may be processed by clock and data recovery (CDR) module 240. CDR 240 recovers both the data and the clock signal embedded in the input data stream received by O/E module 210. Once a clock is reestablished and the received data recovered, the signals may be forwarded to a decoding module, not shown, for error correction processing. The error correction processing may comprise, for example, Forward Error Correcting (FEC) decoding.

Figure 3:
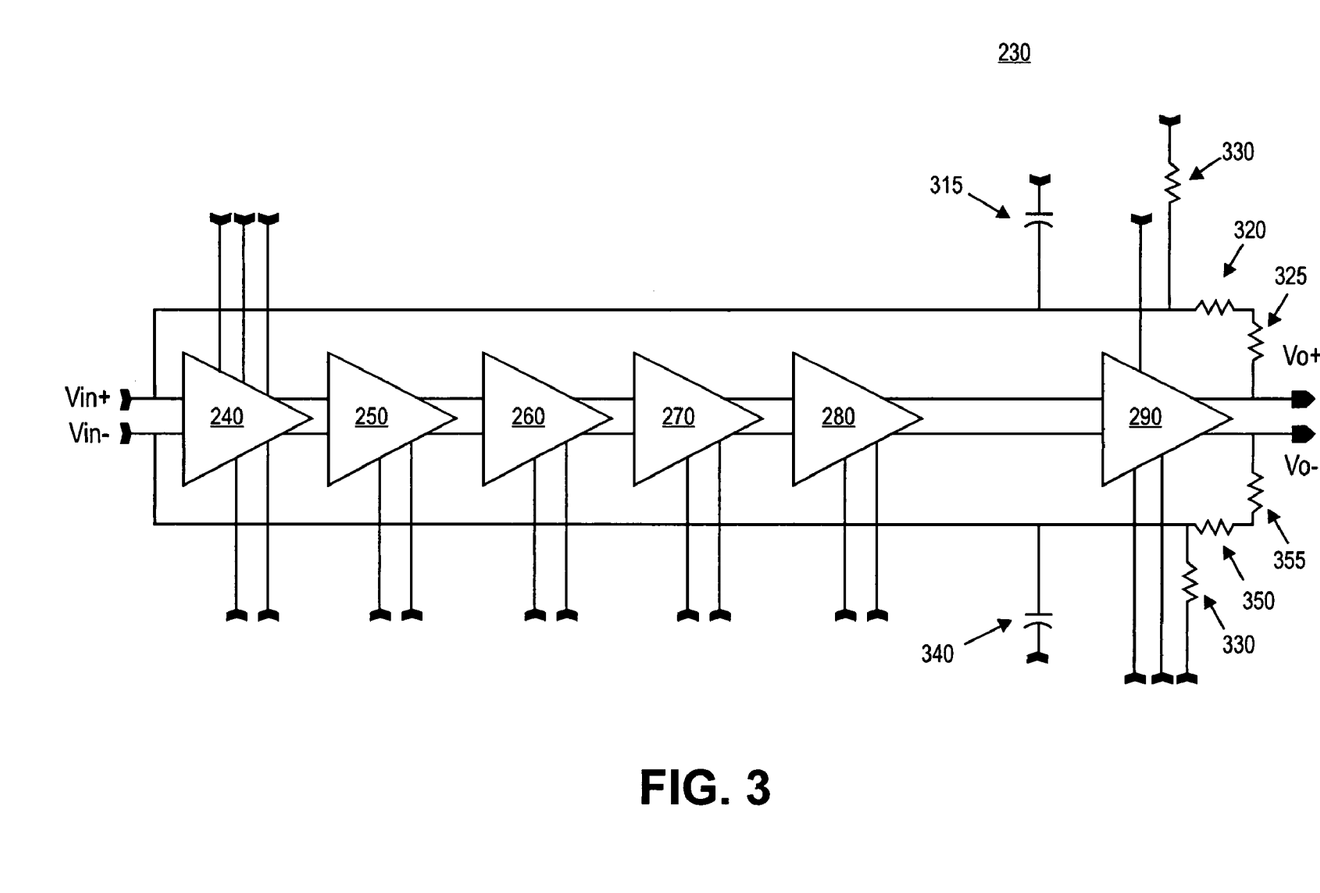
FIG. 3 illustrates a schematic diagram of a limiting amplifier of a system in accordance with one embodiment.

FIG. 3 illustrates a schematic diagram of a multiple stage limiting amplifier 230 coupled to TIA 220. Exemplary amplifier 230 includes input stage 240, intermediate stages 250, 260, 270, 280 and output stage 290. Typically, the voltage levels supplied by the outputs of TIA 220 are insufficient to drive CDR 241. Therefore, limiting amplifier 230 is utilized to increase these voltage levels and provide a sufficiently high voltage gain for further signal processing. Limiting amplifier 230 typically operates in saturation where a small signal input from TIA 220 creates a full swing output. Because the amplifier provides such high gain, multiple stages must be used in order to avoid producing too much gain in any one stage resulting in amplifier instability. Limiting amplifier 230 functions to preserve the data and threshold crossing of the input signal, but it does not preserve the shape of the input signal.

Limiting amplifier 230 has two input terminals Vin+ and Vin− and two outputs Vo+ and Vo−. Limiting amplifier 230 may be a differential amplifier where the output Vo+ and Vo− is proportional to the difference between the two input voltages Vin+ and Vin−. Amplifier 230 may have a high output resistance useful in achieving large voltage gain while providing a highly stable configuration suitable for high frequency optical transceivers. Limiting amplifier 230 also includes a first low pass filter formed by capacitor 315 and resistors 320 and 325 connected to output Vo+ and a second low pass filter formed by capacitor 340 and resistors 350 and 355 connected to output Vo−. The function of the LPF will be described below with respect to FIG. 4. Resistor 330 represents an external pin such that additional external capacitance may be added in parallel to capacitor 320. Limiting amplifier 230 has a threshold or slice level that functions as the initial level of a decision circuit that detects whether the received signals are 1's or 0's, where a voltage above a certain threshold is considered a 1 and a voltage below a certain threshold is considered a 0. Accordingly, amplifier 230 acts as an initial threshold decision, and therefore, it is desirable to avoid drift of even a mV at the outputs $V_{o+}$ and $V_{o-}$ which may compromise signal decision processing. Because the transmitted information signals are high GHz frequencies, sharp clipping is not achieved. Rather, limiting amplifiers generally are small signal high gain amplifiers where high gain is achieved at the threshold level resulting in a softer clip.

As noted above, limiting amplifier 230 functions as a decision level or slice adjust circuit and it also functions as an offset correction. Offset correction or cancellation is a technique to correct amplifier output variation or offset produced from manufacturing induced variations in the structure of the circuit devices that comprise the amplifier. For example, an amplifier may be designed to produce a 0 volt output based on a 0 volt input signal. However, the exemplary 0 volt input may generate a relatively small offset voltage due to manufacturing variances. The offset or differential voltage is fed back and subtracted from the input signal to cancel the offset of the amplifier. Each stage of a multi-stage limiting amplifier multiplies this offset. Therefore, it is advantageous to cancel this offset at the input stage to prevent the offset from multiplying in successive amplifier stages.

Amplifier 230 receives a data signal at inputs Vin+ and Vin−in, for example, an NRZ format to be amplified. The average signal value of this NRZ signal is typically ½ Vdd. The output signal fed back to the amplifier is the true and the inverse of ½ Vdd via the first low pass filter defined by capacitor 315 and resistors 320 and 325 and the second low pass filter defined by capacitor and resistors 350 and 355.

Because amplifiers have offset, the average of the true and the inverse of the data signal is not ½ Vdd. By feeding back this offset signal to the first stage of the differential amplifier and superimposing or subtracting it from the input signal, the offset is cancelled.

As device sizes become smaller and smaller to minimize space and capacitance while maximizing speed in high speed circuits, these device manufacturing variances become more of a problem because the probability of process induced variations in device manufacturing is higher. Thus, larger offsets are produced by these high speed amplifiers utilizing smaller device technology. For example, the circuit of one embodiment is capable of canceling amplifier offset from 50 mv to 500 mv. In order to increase the dynamic range of amplifier 230, the offset is canceled at both the input and first stage 240 of limiting amplifier 230. In this manner, the amplifier offset not canceled at the input of the amplifier is canceled at the first stage, thereby increasing the size of offset the circuit is capable of canceling.

As noted above, limiting amplifier is part of the decision level circuit to determine if the input signal is a logic level 1 or 0. When the output current of the photodetector of O/E module 210 or the voltage output of TIA 220 is low corresponding to a logic level 0, the associated noise component may also be low. However, when the output current of the photodetector of O/E module 210 or the voltage output of TIA 220 is high corresponding to a logic level 1, the associated noise component may also be high. This may require an intentional offset where the slice level is adjusted such that the signal margin above the slice level is symmetric with the signal margin below the slice level. However, if the slice level is adjusted, for example, up 100 mv, then the signal margin above the slice level decreases by 100 mv and the signal margin below the slice level increases 100 mv. The slice level may also be temperature dependent.

Figure 4:
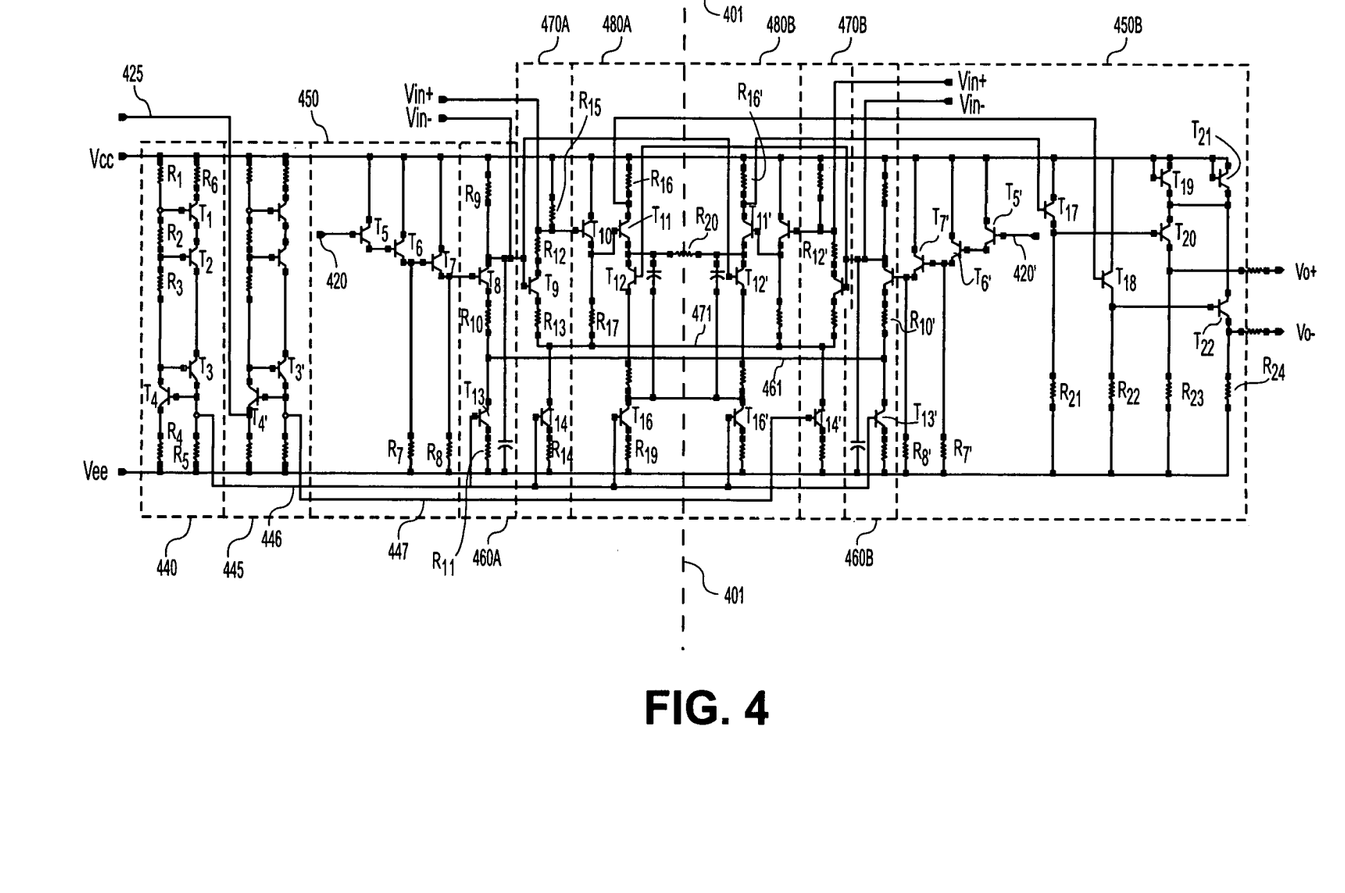
FIG. 4 is a schematic diagram of an offset cancellation and slice adjust circuit of a limiting amplifier in accordance with one embodiment.

FIG. 4 illustrates offset cancellation and slice adjust (OCSA) circuit 400 in accordance with one embodiment. Circuit 400 includes bias generator circuits 440 and 445, high impedance buffer circuits 450A and 450B, differential amplifier circuits 460A and 460B, offset cancellation circuits 470A and 470B and gain/offset cancellation circuits 480A and 480B. OCSA circuit 400 is considered part of the first stage 240 of limiting amplifier 230 where the outputs Vo+ and Vo− are inputs to stage 240. Circuit 400 includes supply inputs Vcc, Vee, common mode input 425 which receives the common mode threshold level adjust input and data signal inputs Vin+ and Vin− which receive the signals to be amplified. Supply Vee is a negative supply to circuit 400 and Vcc is connected to ground. The circuit 400 may be implemented using InP heterojunction bipolar transistor (HBT). As can be seen, the circuit is symmetrical along reference line 401 (inserted for ease of explanation) for circuits 450A and 450B; circuits 460A and 460B; circuits 470A and 470B; circuits 480A and 480B. With the exception of buffer circuit 450B, and unless otherwise denoted, that which is referenced on one side of reference line 401 is likewise applicable to the other side of reference line 401 as explained below.

Bias generator circuits 440 and 445 are used to bias the differential amplifier stages of amplifier 230 in accordance with one embodiment. The following description of bias generator circuit 440 is equally applicable to circuit 445, however, bias circuit 440 is used to bias differential amplifier circuits 460A and 460B as well as gain/offset cancellation circuits 480A and 480B; whereas, bias circuit 445 is used to bias offset cancellation circuits 470A and 470B.

Input Vcc provides a voltage across resistors R1, R2, R6 and the collector terminal of transistor T1 of bias generator circuit 440. Transistor T1 is an emitter-follower transistor where a change in base voltage Vb appears as an equal change across the load at the emitter Vbe. The emitter follower provides temperature and voltage tracking. The ratio of resistors R1 and R2 sets the output voltage of the emitter follower transistor T1 and the source current is set by Vbe across transistor T1 divided by R1 (Vbe/R1).

The emitter of transistor T1 is connected to the collector of transistor T2 where transistor T2 and resistor R3 function as a voltage regulator to the collector of transistor T3. Resistor R3 is connected to resistor R2 and the base of transistor T2. The voltage drop across R2 plus the voltage across R3 provides the base voltage Vb2 to transistor T2. The base of transistor T3 is connected to the collector of transistor T4 and resistor R3. Resistor R4 is connected to the emitter of transistor T4, to Vee supply and resistor R5 is commonly connected to the base of transistor T4 and the emitter of transistor T3. The current through transistor T3 drops across resistor R5. This allows the Vbe bias of transistor T4 and the current to feed back through the emitter follower circuit. Common mode input 425 receives a common mode threshold level adjust signal which is supplied to the emitter of transistor T4' of circuit 446.

The output from the emitter terminal of T3 is connected, via electrical connection 446, to transistors T13 of differential amplifier circuit 460A, transistor T16 of gain/offset cancellation circuit 480A, T16' of gain/offset cancellation circuit 480B, and T13' of differential amplifier circuit 460B. Similarly, transistor T3' of bias generator circuit 445 is connected, via electrical connection 447, to the base terminal of transistor T14 of differential amplifier circuit 470A and base terminal of transistor T14' of gain/offset cancellation circuit 470B. The emitter output of transistor T3' is used to bias current sources of offset cancellation circuits 470A and 470B where the current sources are defined by transistor T14 and resistor R14 for circuit 470A, and transistor T14' and resistor R14' for circuit 470B. In this manner the current sources are biased to adjust the dc levels of the input up or down to produce the common mode level adjust. This common mode threshold level adjust moves the slice level up or down the same amount on both sides of the signal such that the margin above the slice level is symmetric with the signal margin below the slice level. This slice adjust level is also temperature dependent such that as the temperature changes thereby effecting the signal levels, the slice level likewise will adjust to ensure that this signal margin is maintained.

High impedance buffer circuit 450A includes transistors T5, T6, T7 and relatively high value (e.g. 10 k ohms) emitter resistors R7 and R8. Input 420 receives the positive output voltage from low pass filter formed by capacitor 315 and resistors 320 and 325 shown in FIG. 3. Similarly, input 420' receives the negative output voltage from the low pass filter formed by capacitor 340 and resistors 350 and 355 shown in FIG. 3. By utilizing the Darlington transistor configuration together with the low pass filter, lower value external filter capacitors may be used. A potentiometer may be connected to input 420 to adjust the slice control voltage and by pulling this control voltage up, it will have an opposite effect on the corresponding signal to input 420' thereby pulling the control voltage down and vice versa.

Transistors T5, T6 and T7 form a triple Darlington configuration. In this configuration, high current gain is achieved as the emitter output of transistor T5 is connected to the base current input of transistor T6 and the emitter output of transistor T6 is the base current input of T7. The current gain is approximately equal to the product of the individual transistor current gains. However, the voltage required to turn the Darlington transistors "on" is the sum of the "on" voltages for transistors T5, T6 and T7. Because transistor T5 is a bipolar transistor and utilizes a current input signal, a high impedance value is required that essentially looks like an open circuit to avoid current leakage from the low pass filter. In this manner, high input impedance is provided using the Darlington configuration with low input leakage current buffer for the output of the low pass filter formed by capacitor 315 and resistors 320 and 325. Similarly, transistor T5', T6' and T7' form the corresponding triple Darlington in corresponding buffer circuit 450B. Resistors R7' and R8' connected to transistors T6' and T7' are the corresponding emitter resistors. Buffer circuit 450B also includes emitter resistors R21, R22, R23 and R24 which are connected to the emitters of transistors T17, T18, T20, and T22 respectively. The base terminal of transistor T17 is connected to the collector of transistor T11' of gain/offset cancellation circuit 480B and receives the voltage drop across R16'. The signal from the emitter of transistor T17 is supplied to the base of transistor T20. The input of transistor T18 is connected to the collector of transistor T11 of gain/offset cancellation circuit 480B. The output of the emitter of transistor T18 is connected to the base of transistor T22 and the emitter of transistor T21 is connected to the collector of output transistor T22. Again, high input impedance is provided by the buffer circuits using the Darlington configuration with low input leakage current buffer for the output of the low pass filters formed.

Differential amplifier circuit 460A includes resistors R9, R10, R11 and transistors T8 and T13. Circuit 460A is connected to circuit 460B via electrical connection line 461 where together with circuit 460B define the differential amplifier circuit of OCSA circuit 400. Data signal input Vin− is supplied to the collector of transistor T8 and the output of the darlington configuration is supplied to the base terminal of transistor T8 via the emitter of transistor T7. Because emitter follower transistor T8 receives the RF input from Vin−, transistor T8 has the lowest capacitance. Transistor T8 provides the input to offset cancellation circuit 470A. Emitter resistor R10 is used to set the gain of the differential amplifier which can be expressed as the collector resistor R9/emitter resistor R10. For example, this amplifier may have a beta, or gain of 10 (Gh/(1+Gh)). This gain value is relatively low to ensure that the amplifier is unconditionally stable in that it always has a >90 degree phase margin due to the amplifier feedback. Transistor T13 and resistor R11 form a current source for the differential amplifier circuit. The current source transistor T13 is separated from transistor T8 so that it may be independently controlled for the common mode level adjust noted above.

Offset cancellation circuit 470A includes resistors R12, R13, R14 and R15 and transistors T9 and T14. Circuit 470A is connected to circuit 470B via electrical connection line 471 where together they form the offset cancellation circuit of OCSA circuit 400. Input signal voltage Vin+ is supplied to differential amplifier circuit 470A via resistor R12 which is referred to as a terminating resistor and may be, for example, a 50 ohm resistor connected to the collector of transistor T9. Similarly, input signal voltage Vin+ is supplied to differential amplifier circuit 470B via resistor R12'. Again, the description of offset cancellation circuit 470A is equally applicable to corresponding offset cancellation circuit 470B. Resistor R13 is disposed between the emitter of emitter follower transistor T9 and the collector of transistor T14, as well as being connected to resistor R14 forming the differential amplifier circuit 470B. The input signal Vin+ is dropped across resistor R12 and goes through emitter follower transistor T9 to level shift the input signal. Resistor R13 may be, for example, a 300Ω resistor that provides RF isolation of the input bias current source from transistor T9. In this manner, the signal across R13 will be voltage divided down to the lower resistance path to provide a quiescent dc bias voltage of, for example −250 mv, which is the 50% point of the current mode logic (CML) swing (0v to −500 mv).

Transistor T9 skews the slice level at the amplifier inputs Vin+ and acts like a current source where circuit 470A will add current and circuit 470B will subtract current to skew the threshold level at the input of OCSA 400. Resistor R14 is connected to the emitter of transistor T14 and together with transistor T14 form the current source for differential amplifier circuit 470A. Similarly, transistor T14' and resistor R14' form the current source for cancellation circuit 470B. Resistor R14 is considered a differential emitter degeneration resistor that is high frequency AC bypassed. The ratio of differential emitter degeneration resistors R14 and R14' and the collector load resistors R13 and R13' sets the gain of the amplifier. The base inputs of transistors T14 and T14' are connected to bias generator circuit 445 which is used to bias the differential amplifier circuit 470A and 470B, respectively. In this manner the bias of the two current sources formed by transistor T14 and resistor R14 for circuit 470A and transistor T14' and resistor R14' for circuit 470B, adjust the dc level of the input up or down providing the common mode level adjustment. The current source transistors T14 and T14' are separated so that they may independently control the common mode level adjust.

Gain/offset cancellation circuit 480A includes resistors R16, R17, R18 and R19 and transistors T10, T11, T12 and T16. Input voltage Vin+ supplies the base of transistor T10 and the output emitter of transistor T10 supplies the base of transistor T11. R16 is connected to the collector of T11 and the collector of transistor T12 is connected to the emitter output of transistor T11. A current source is defined by transistor T16 and resistor R19 and is separated from transistor T12 by resistor R18. Resistor R18 provides RF isolation to the current source from transistor T12. Again, gain/offset cancellation circuit 480A is symmetrical with gain/offset cancellation circuit 480B and is separated via resistor R20 which is connected to the common emitter/collector connection of transistors T11 and T12 and the common emitter/collector connection of transistors T11' and T12'. The output of the differential amplifier circuit adjusts the current sources which set the quiescent input voltage of the amplifier. This configuration compensates and cancels offsets that are present in the amplifier for a particular dynamic range.

While certain features of the embodiments have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. An apparatus, comprising
a slice adjust circuit coupled to an amplifier input terminal and configured to adjust a slice level such that a signal margin above said slice level is symmetric with the signal margin below said slice level;
an offset cancellation circuit coupled to an amplifier output terminal, said offset cancellation circuit configured to receive an undesired offset signal and feed said signal back to said amplifier input terminal to cancel said undesired offset signal; and a high impedance buffer circuit coupled to said offset cancellation circuit, said buffer circuit configured to provide high current gain and a high impedance value for said amplifier.

2. An apparatus, comprising:

a slice adjust circuit coupled to an amplifier input terminal and configured to adjust a slice level such that a signal margin above said slice level is symmetric with the signal margin below said slice level;

an offset cancellation circuit coupled to an amplifier output terminal, said offset cancellation circuit configured to receive an undesired offset signal and feed said signal back to said amplifier input terminal to cancel said undesired offset signal; and wherein said offset cancellation circuit further comprises an emitter follower transistor and a terminating resistor connected to the collector of said emitter follower transistor.

3. The apparatus of claim 2, wherein said offset cancellation circuit further comprises a current source coupled to said emitter follower transistor.

4. The apparatus of claim 3, wherein said offset cancellation circuit further comprises a resistor coupled between an emitter terminal of said emitter follower transistor and said current source, said resistor configured to provide RF isolation of said emitter follower transistor.

5. The apparatus of claim 1, further comprising:

a limiting amplifier; and a differential amplifier circuit coupled to said offset cancellation circuit and said high impedance buffer circuit, said differential amplifier circuit configured to set a quiescent input voltage for said amplifier.

6. The apparatus of claim 5, wherein said differential amplifier circuit further comprising a transistor configured to receive an output of said high impedance buffer circuit and a current source coupled to said transistor.

7. The apparatus of claim 5, further comprising an amplifier bias circuit, said bias circuit configured to provide a bias voltage control signal to said differential amplifier circuit.

8. The apparatus of claim 1, further comprising an optical transmission medium configured to supply information data signals to said amplifier.

9. An apparatus, comprising:

a limiting amplifier having an input terminal and an output terminal, said limiting amplifier comprising a plurality of amplifier stages;

a slice adjust circuit coupled to said input terminal, said circuit configured to adjust a slice level in response to a temperature measurement of said amplifier;

an offset cancellation circuit coupled to said output terminal, said cancellation circuit configured to generate a signal to voltage compensate an offset associated with said amplifier output and supply said voltage compensating signal to said amplifier input and apply a current bias offset canceling differential to a first stage of said plurality of amplifier stages; and a high impedance buffer circuit coupled to said offset cancellation circuit, said buffer circuit configured to provide high current gain and a high impedance value.

10. An apparatus, comprising:

a limiting amplifier having an input terminal and an output terminal, said limiting amplifier comprising a plurality of amplifier stages;

a slice adjust circuit coupled to said input terminal, said circuit configured to adjust a slice level in response to a temperature measurement of said amplifier;

an offset cancellation circuit coupled to said output terminal, said cancellation circuit configured to generate a signal to voltage compensate an offset associated with said amplifier output and supply said voltage compensating signal to said amplifier input and apply a current bias offset canceling differential to a first stage of said plurality of amplifier stages; and wherein said offset cancellation circuit further comprises an emitter follower transistor and a terminating resistor connected to the collector of said emitter follower transistor.

11. The apparatus of claim 10 wherein said offset cancellation circuit further comprises a current source coupled to said emitter follower transistor.

12. The apparatus of claim 11, wherein said offset cancellation circuit further comprises a resistor coupled between an emitter terminal of said emitter follower transistor and said current source, said resistor configured to provide RF isolation of said emitter follower transistor.

13. The apparatus of claim 9, further comprising a differential amplifier circuit coupled to said offset cancellation circuit and said high impedance buffer circuit, said differential amplifier circuit configured to set a quiescent input voltage of said amplifier.

14. The apparatus of claim 13, wherein said differential amplifier circuit further comprising a transistor configured to receive an output of said high impedance buffer circuit and a current source coupled to said transistor.

15. The apparatus of claim 13, further comprising an amplifier bias circuit, said bias circuit configured to provide a bias voltage control signal to said differential amplifier stage.

16. The apparatus of claim 9, further comprising an optical transmission medium configured to supply information data signals to said amplifier.

* * * * *

UNITED STATES PATENT AND TRADEMARK OFFICE
CERTIFICATE OF CORRECTION

PATENT NO. : 7,088,174 B2  Page 1 of 1
APPLICATION NO. : 10/745428
DATED : August 8, 2006
INVENTOR(S) : Glass It is certified that error appears in the above-identified patent and that said Letters Patent is hereby corrected as shown below:

On the Title page, in field (56), under "Other Publications", in column 2, line 7, delete "AIGaAs" and insert -- AlGaAs --, therefor.

On the Title page, in field (56), under "Other Publications", in column 2, line 10, delete "AIGaAs" and insert -- AlGaAs --, therefor.

On the Title page, in field (56), under "Other Publications", in column 2, line 16, delete "AIGaAs" and insert -- AlGaAs --, therefor.

In column 8, line 61, in Claim 1, after "comprising" insert -- : --.

Signed and Sealed this

First Day of April, 2008

JON W. DUDAS
*Director of the United States Patent and Trademark Office*